(12) United States Patent
Watahiki et al.

(10) Patent No.: US 11,222,985 B2
(45) Date of Patent: Jan. 11, 2022

(54) POWER SEMICONDUCTOR DEVICE

(71) Applicants: Mitsubishi Electric Corporation, Chiyoda-ku (JP); Tokyo Institute of Technology, Meguro-ku (JP)

(72) Inventors: Tatsuro Watahiki, Tokyo (JP); Yohei Yuda, Tokyo (JP); Akihiko Furukawa, Tokyo (JP); Shinsuke Miyajima, Tokyo (JP); Yuki Takiguchi, Tokyo (JP)

(73) Assignees: Mitsubishi Electric Corporation, Chiyoda-ku (JP); Tokyo Institute of Technology, Meguro-ku (JP)

( * ) Notice: Subject to any disclaimer, the term of this patent is extended or adjusted under 35 U.S.C. 154(b) by 161 days.

(21) Appl. No.: 16/475,396

(22) PCT Filed: Feb. 14, 2017

(86) PCT No.: PCT/JP2017/005286
§ 371 (c)(1),
(2) Date: Jul. 2, 2019

(87) PCT Pub. No.: WO2018/150451
PCT Pub. Date: Aug. 23, 2018

(65) Prior Publication Data
US 2020/0295203 A1   Sep. 17, 2020

(51) Int. Cl.
*H01L 29/872* (2006.01)
*H01L 21/02* (2006.01)
(Continued)

(52) U.S. Cl.
CPC ...... *H01L 29/872* (2013.01); *H01L 21/02565* (2013.01); *H01L 29/24* (2013.01); *H01L 29/242* (2013.01); *H01L 29/66969* (2013.01)

(58) Field of Classification Search
CPC .............. H01L 29/0619; H01L 29/872; H01L 21/02565; H01L 29/24; H01L 29/242;
(Continued)

(56) References Cited

U.S. PATENT DOCUMENTS

2008/0019901 A1* 1/2008 Shen .................... C01B 3/26
423/594.19
2011/0048538 A1* 3/2011 Huang .................. H01L 51/441
136/265
(Continued)

FOREIGN PATENT DOCUMENTS

JP    2012-216780 A    11/2012
JP    2016-25256 A     2/2016
(Continued)

OTHER PUBLICATIONS

Kokubun et al., All-oxide p-n heterojunction diodes comprising p-type NiO and n-type B-Ga2O3, 2016, pp. 2-4 (Year: 2016).*
(Continued)

*Primary Examiner* — Wasiul Haider
(74) *Attorney, Agent, or Firm* — Oblon, McClelland, Maier & Neustadt, L.L.P.

(57) ABSTRACT

An n-type semiconductor layer has a single-crystal structure and is made of a wide-gap semiconducting material. A p-type semiconductor layer is provided on the n-type semiconductor layer and made of a material different from the aforementioned wide-gap semiconducting material, and has either a microcrystalline structure or an amorphous structure. An electrode is provided on at least one of the n-type semiconductor layer and the p-type semiconductor layer.

9 Claims, 9 Drawing Sheets

(51) Int. Cl.
*H01L 29/24* (2006.01)
*H01L 29/66* (2006.01)

(58) Field of Classification Search
CPC ........... H01L 29/66969; H01L 29/8613; H01L 29/0692; H01L 29/402
See application file for complete search history.

(56) References Cited

U.S. PATENT DOCUMENTS

2011/0108837 A1* 5/2011 Yamazaki ................ G09G 3/20
257/43
2014/0009514 A1 1/2014 Abe et al.

FOREIGN PATENT DOCUMENTS

JP 2016-92168 A 5/2016
WO WO 2014/049802 A1 4/2014

OTHER PUBLICATIONS

International Search Report dated Apr. 25, 2017 in PCT/JP2017/005286 filed on Feb. 14, 2017.
Sasaki, K. et al., "β-$Ga_2O_3$ Schottky Barrier Diode with Field Plate Edge Termination," $76^{th}$ Japan Society of Applied Physics Autumn Academic Lecture Preprint, 2015, 16p-4C-8, 2 pages (with unedited computer-generated English translation).

* cited by examiner

F I G. 10
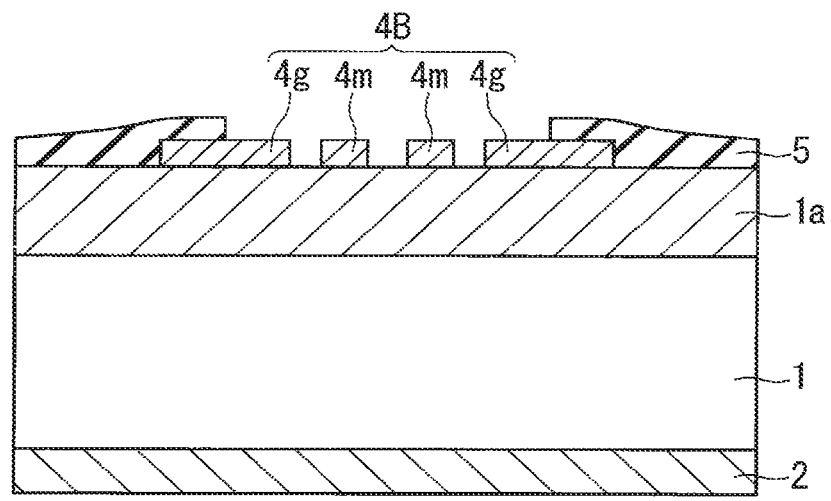
F I G. 11
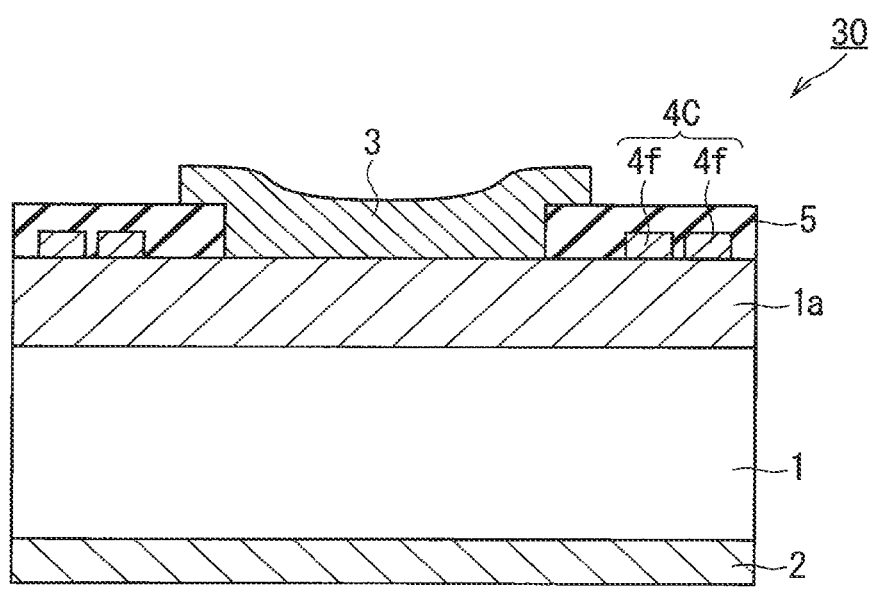

POWER SEMICONDUCTOR DEVICE

TECHNICAL FIELD

The present invention relates to a power semiconductor device, and in particular to a power semiconductor device using a wide-gap semiconducting material.

BACKGROUND ART

Diodes are power semiconductor devices indispensable for power conversion systems such as converters or inverters, along with switching devices such as insulated gate bipolar transistors (IGBTs) and metal-oxide semiconductor field-effect transistors (MOSFETs). The application of these power conversion systems has been spread to equipment of various fields, including not only industrial and household electrical equipment but also other equipment such as transportation equipment including railway vehicles and automobiles and power transmission and distribution equipment in electric power systems. With this and other developments as backgrounds, power semiconductor devices such as diodes and switching devices are required to have high electric power and low power loss. Thus, although power semiconductor devices using silicon (Si) have conventionally been the mainstream, power semiconductor devices using a semiconducting material such as silicon carbide (SiC) or gallium nitride (GaN) whose band gap is larger than that of Si are now under development.

Examples of the diodes serving as typical power semiconductor devices include pn diodes and Schottky barrier diodes. The pn diodes that can form a high barrier are advantageous in terms of improvement in withstand voltage and suppression of leakage current. The pn diodes also have the advantage of being able to pass a large current therethrough. On the other hand, as compared with the pn diodes, the Schottky barrier diodes can in principle reduce the forward voltage. Thus, in high power applications where a large current flows into diodes, the Schottky barrier diodes can be used to improve efficiency of power conversion systems. The Schottky barrier diodes, which are unipolar devices, are also capable of higher speed switching than the pn diodes, which are bipolar devices. Accordingly, the power conversion systems can be reduced in size by increasing the switching frequencies of the Schottky barrier diodes.

In particular, in the case where SiC having a larger bandgap than that of Si is used as a semiconducting material, it is possible to increase the reverse withstand voltage when a reverse bias is applied. For example, SiC Schottky barrier diodes having reverse withstand voltages of several kilovolts are put into practical use. In order to obtain a higher withstand voltage, for example, a guard ring structure or a field limiting ring (FLR) structure is generally used as disclosed in Patent Document 1. In such structures, for example, a p-type semiconductor layer formed by ion implantation is used so as to alleviate an electric field by a homo pn junction.

In recent years, consideration is being given to using oxide semiconductors such as gallium oxide ($Ga_2O_3$) semiconductors that have larger bandgaps than those of SiC and GaN in order to allow the power semiconductor devices to have higher electric power and lower power loss. A typical Schottky barrier diode using gallium oxide includes an n-type gallium oxide substrate that contains n-type impurities (donors) and has one and the other surfaces, a cathode electrode that forms an ohmic junction with the one surface of the n-type gallium oxide substrate, an n-type gallium oxide layer that is provided on the other surface of the n-type gallium oxide substrate and has a lower n-type carrier density than that of the n-type gallium oxide substrate, and an anode electrode that is provided on the n-type gallium oxide layer and forms a Schottky junction with the n-type gallium oxide layer. In order to increase the withstand voltage of such a Schottky barrier diode using gallium oxide, it is proposed to adopt a field plate structure using an insulation film, as described in Non-Patent Document 1, for example.

PRIOR ART DOCUMENTS

Patent Document

Patent Document 1: Japanese Patent Application Laid-Open No. 2016-92168

Non-Patent Document

Non-Patent Document 1: Kohei SASAKI, et. al., "β-$Ga_2O_3$ Schottky Barrier Diode with Field Plate Edge Termination" in proceedings of the 76th JSAP Autumn Meeting, 2015, 16p-4C-8

SUMMARY

Problem to be Solved by the Invention

It can be thought that, even in the case of using an oxide semiconductor, the reverse withstand voltage can be increased if the Schottky barrier diode or the pn diode has a structure such as a guard ring structure or an FLR structure. Also, if the manufacture of a pn diode is possible, due to the principles of the pn diode, a higher withstand voltage can be obtained than in the case of using a Schottky barrier diode. In either case, a pn junction structure is used. Thus, there is also demand for a technique that gives not only n-type conductivity but also p-type conductivity to a semiconductor.

However, in the case of using a wide-gap semiconducting material, it is often difficult to produce a p-type semiconductor with excellent properties, and if the wide-gap semiconducting material is an oxide and in particular gallium oxide, it is difficult to give p-type conductivity. The reason for this is that acceptors for providing p-type conductivity exist at a very deep level. Even if the acceptors are activated, their effective mass is infinite and very large, and thus substantial p-type conductivity cannot be expected. The same also applies to a wide-gap material of nitride. For example, materials such as aluminum nitride have difficulty in forming a good-quality p-type semiconductor. Thus, it has been difficult to improve the withstand voltage with use of a pn junction.

The present invention has been achieved in view of the above-described problem, and it is an object of the present invention to provide a power semiconductor device capable of improving the withstand voltage with use of a pn junction, while using a semiconducting material that has difficulty in having p-type conductivity on grounds of the properties of the material itself or the semiconductor device manufacturing process using that material.

Means to Solve the Problem

A power semiconductor device according to the present invention includes an n-type semiconductor layer, a p-type semiconductor layer, and an electrode. The n-type semiconductor layer has a single-crystal structure and is made of a wide-gap semiconducting material. The p-type semiconductor layer is provided on the n-type semiconductor layer and made of a material different from the aforementioned wide-gap semiconducting material, and has either a microcrystalline structure or an amorphous structure. The electrode is provided on at least one of the n-type semiconductor layer and the p-type semiconductor layer.

Note that the aforementioned limitation "made of a material different from" refers to a limitation on the semiconducting material that serves as a base material, and this limitation is irrelevant to impurity elements (donors and acceptors) that can be added to the base material in order to adjust the conductivity of the base material serving as a semiconductor.

Effects of the Invention

According to the present invention, the material for the p-type semiconductor layer differs from the wide-gap semiconducting material for the n-type semiconductor layer. Thus, a material to which p-type conductivity is readily given can be selected as the material for the p-type semiconductor layer. Also, the p-type semiconductor layer has either a microcrystalline structure or an amorphous structure. Thus, the p-type semiconductor layer can be formed on the n-type semiconductor layer without being greatly affected by the crystal structure and shape of the surface of the n-type semiconductor layer. This stabilizes the properties of a heterojunction between the n-type semiconductor layer and the p-type semiconductor layer. Consequently, an excellent pn junction can be formed on the n-type semiconductor layer made of the wide-gap semiconductor. Using a structure including this pn junction can improve the withstand voltage of the power semiconductor device.

The object, features, and advantages relating to the technique disclosed in the specification of the present application will become further apparent from the following detailed description and the accompanying drawings.

BRIEF DESCRIPTION OF DRAWINGS

FIG. 10 is a sectional view schematically illustrating one step in the method of manufacturing the power semiconductor device according to Embodiment 2 of the present invention.

FIG. 11 is a sectional view schematically illustrating a configuration of a power semiconductor device according to Embodiment 3 of the present invention.

DESCRIPTION OF EMBODIMENTS

Figure 1:
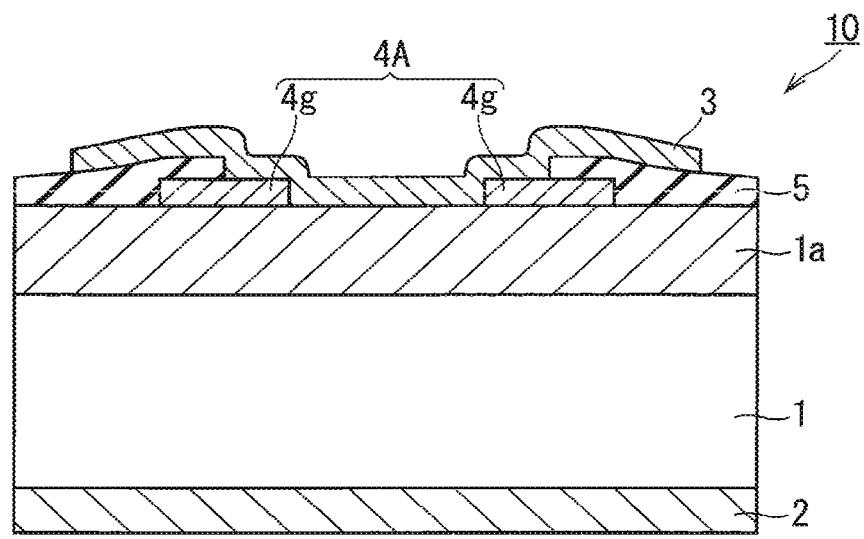
FIG. 1 is a sectional view schematically illustrating a configuration of a power semiconductor device according to Embodiment 1 of the present invention.

Hereinafter, embodiments of the present invention will be described with reference to the drawings. Note that parts that are identical or correspond to those in the following description are given the same reference numerals, and description thereof is not repeated.

Embodiment 1

Configuration

Figure 2:
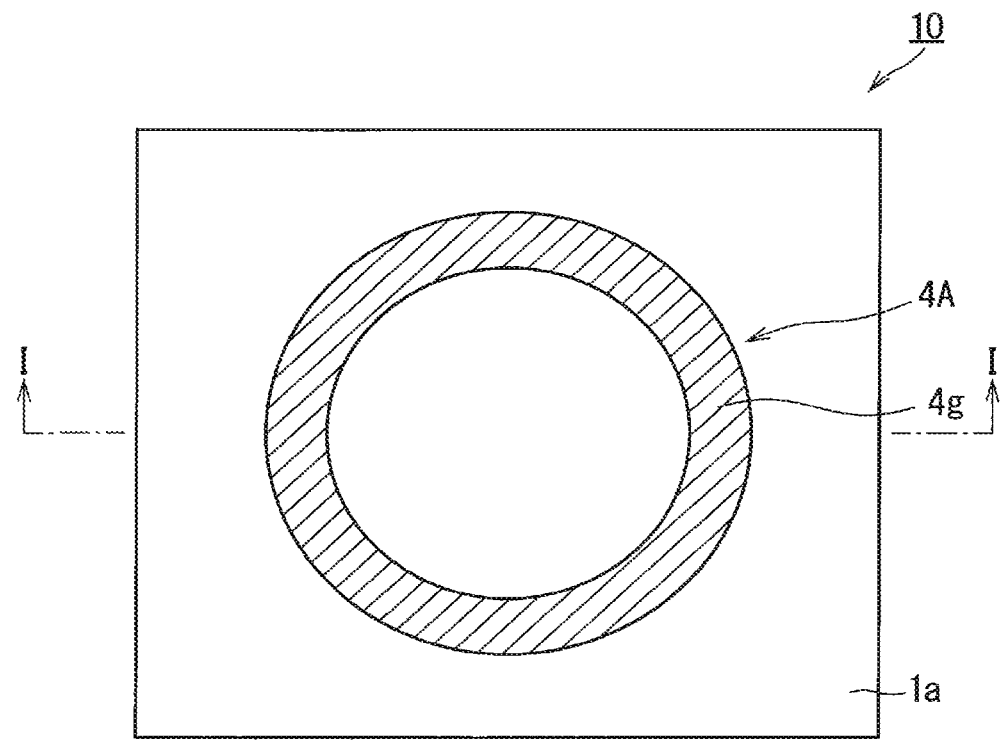
FIG. 2 is a plan view schematically illustrating an arrangement of a p-type semiconductor layer on an n-type semiconductor layer in the power semiconductor device in FIG. 1.

FIG. 1 is a sectional view schematically illustrating a configuration of a Schottky barrier diode 10 (power semiconductor device) according to Embodiment 1 of the present invention. The Schottky barrier diode 10 includes an n-type gallium oxide substrate 1 (single-crystal substrate), an n-type gallium oxide layer 1a (n-type semiconductor layer), a cathode electrode 2, an anode electrode 3 (electrode), a p-type $Cu_2O$ layer 4A (p-type semiconductor layer), and an insulating layer 5. FIG. 2 is a plan view schematically illustrating an arrangement of the p-type $Cu_2O$ layer 4A on the n-type gallium oxide layer 1a in the Schottky barrier diode 10. In this plan view, the p-type $Cu_2O$ layer 4A is hatched in order to facilitate viewing of the drawing.

The n-type gallium oxide substrate 1 is a single-crystal semiconductor substrate. The n-type gallium oxide substrate 1 has a first surface (upper surface in the drawing) and a second surface (lower surface in the drawing). The n-type gallium oxide substrate 1 is preferably made of $\beta$-$Ga_2O_3$. A gallium oxide semiconductor exhibits n-type conductivity due to oxygen deficiencies in the crystal. Thus, n-type gallium oxide does not necessarily have to contain n-type impurities (donors), but it may contain n-type impurities such as silicon (Si) or tin (Sn). That is, the n-type gallium oxide substrate 1 may be any of the following: one that exhibits n-type conductivity due only to oxygen deficiencies, one that exhibits n-type conductivity due only to n-type impurities, and one that exhibits n-type conductivity due both to oxygen deficiencies and to n-type impurities. The n-type carrier density of the n-type gallium oxide substrate 1 is a total of the density of oxygen deficiencies and the density of n-type impurities and is, for example, in the range of approximately $1\times10^{17}$ $cm^{-3}$ to $1\times10^{19}$ $cm^{-3}$.

The n-type gallium oxide layer 1a is an epitaxial layer provided on the upper surface of the n-type gallium oxide substrate 1. The n-type semiconductor layer 1a has a single-crystal structure. The gallium oxide serving as the material for the n-type gallium oxide layer 1a is a wide-gap semiconducting material, and in particular a wide-gap semiconducting material containing metallic elements. The term "wide-gap" as used herein refers to a bandgap greater than or equal to the bandgap of SiC. Note that the bandgap of the n-type semiconductor layer is preferably greater than the bandgap of SiC and more preferably greater than the bandgap of GaN. In order to increase the withstand voltage of the Schottky barrier diode 10, the n-type carrier density of the n-type gallium oxide layer 1a is preferably lower than that of the n-type gallium oxide substrate 1 and is, for example, in the range of approximately $1\times10^{14}$ $cm^{-3}$ to $1\times10^{17}$ $cm^{-3}$.

The p-type $Cu_2O$ layer 4A is provided on the n-type gallium oxide layer 1a. In the present embodiment, $Cu_2O$ serving as the material for the p-type $Cu_2O$ layer 4A is used as a metal oxide material different from the aforementioned wide-gap semiconducting material, and in particular as a material containing either Cu or Ni. Thus, the n-type semiconductor layer 1a and the p-type $Cu_2O$ layer 4A form a hetero pn junction. A barrier between the p-type $Cu_2O$ layer 4A and the n-type gallium oxide layer 1a, viewed from the electron side, is higher than or equal to 1.2 eV.

In the p-type $Cu_2O$ layer 4A, the 3d orbitals of Cu atoms form the upper edge of the valence band responsible for hole conduction. Development of holes due to Cu deficiencies imparts p-type conductivity. The degree of p-type conductivity may be controlled by adding impurities such as nitrogen. The carrier density of the p-type $Cu_2O$ layer 4 is preferably higher than that of the n-type gallium oxide layer 1a and is, for example, in the range of approximately $1\times10^{18}$ $cm^{-3}$ to $1\times10^{20}$ $cm^{-3}$. The p-type $Cu_2O$ layer 4A has a thickness of approximately 10 nm to 500 nm, for example.

The p-type $Cu_2O$ layer 4A has either a microcrystalline structure or an amorphous structure. The term "microcrystalline structure" as used herein refers to a structure that includes a large number of crystal grains with sizes of approximately several nanometers to several micrometers. An amorphous phase may exist between these crystal grains. Typically, the sizes of the crystal grains are approximately smaller than or equal to 100 nm in the direction of the film thickness. Using the microcrystalline structure or the amorphous structure allows stable pn-junction properties to be maintained with respect to a given crystal face of the n-type gallium oxide layer 1a. If a good-quality p-type single-crystal layer is to be obtained as a p-type semiconductor layer by epitaxial growth on the crystal face of the n-type gallium oxide layer 1a, which serves as the n-type semiconductor layer having a single-crystal structure, consideration needs to be given to lattice matching. This imposes limitations on an applicable material and composition. For this reason, there is no guarantee that a material with excellent conductivity and capable of providing an appropriate barrier height of the pn junction will be applied. Besides, depending on requirements such as required device performance, the surface of the n-type single-crystal layer on which a p-type semiconductor layer is to be formed is required to have a specific crystal orientation. For this reason, there is no guarantee that a crystal orientation suitable for the epitaxial growth of the p-type single-crystal layer will be used. Moreover, in the case where an irregular shape such as a trench structure or a mesa structure is formed on the n-type semiconductor layer, it may not be possible due to this irregular shape to grow a favorable single crystal. In contrast, if the p-type semiconductor layer has a microcrystalline structure or an amorphous structure, the p-type semiconductor layer can be formed on the n-type semiconductor layer having any crystal orientation and any shape such that stable pn-junction properties can be obtained. By using this pn-junction to form a structure capable of alleviating an electric field in the power semiconductor device, it is possible to obtain a high withstand-voltage structure.

Preferably, in the case where the p-type $Cu_2O$ layer 4A has a microcrystalline structure, crystal grains have crystalline sizes smaller than an average film thickness of the p-type $Cu_2O$ layer 4A in the direction of the film thickness of the p-type $Cu_2O$ layer 4A (longitudinal direction in FIG. 1). In particular, during the growth of the p-type $Cu_2O$ layer 4A, columnar growth from crystal nuclei is likely to occur, and therefore consideration should preferably be given to not excessively increasing crystalline sizes in the direction of the film thickness. If the crystalline sizes are greater than or equal to the average film thickness in the direction of the film thickness, crystal grains can easily pass through the p-type $Cu_2O$ layer 4A between the n-type gallium oxide layer 1a and the anode electrode 3. That is, a current path along the grain boundary is easily formed, which connects the n-type gallium oxide layer 1a and the anode electrode 3. Thus, current is likely to flow along the grain boundary between the n-type gallium oxide layer 1a and the anode electrode 3. As a result, the leakage current will increase at a reverse bias. Conversely, if the crystalline sizes are smaller than the average film thickness in the direction of the film thickness, crystal grains cannot easily pass through the p-type $Cu_2O$ layer 4A between the n-type gallium oxide layer 1a and the anode electrode 3. That is, the current path along the grain boundary, which connects the n-type gallium oxide layer 1a and the anode electrode 3, is not easily formed. This restricts a current flow along the grain boundary between the n-type gallium oxide layer 1a and the anode electrode 3. As a result, the leakage current will be suppressed at a reverse bias. This helps improving the withstand voltage.

More preferably, the crystalline sizes are smaller than a half of the average film thickness of the p-type $Cu_2O$ layer 4A in the direction of the film thickness of the p-type $Cu_2O$ layer 4A. If the crystalline sizes are greater than or equal to the half of the average film thickness in the direction of the film thickness, in the case where a pair of crystal grains are connected in the direction of the film thickness in the p-type $Cu_2O$ layer 4A, this pair of crystal grains can easily pass through the p-type $Cu_2O$ layer 4A between the n-type gallium oxide layer 1a and the anode electrode 3. That is, a current path along the grain boundary is easily formed, which connects the n-type gallium oxide layer 1a and the anode electrode 3. Thus, current is likely to flow along the grain boundary between the n-type gallium oxide layer 1a and the anode electrode 3. As a result, the leakage current will increase at a reverse bias. In contrast, if the crystalline sizes are smaller than the half of the average film thickness in the direction of the film thickness, even in the case where a pair of crystal grains are connected in the direction of the film thickness in the p-type $Cu_2O$ layer 4A, this pair of crystal grains cannot easily pass through the p-type $Cu_2O$ layer 4A between the n-type gallium oxide layer 1a and the anode electrode 3. That is, the current path along the grain boundary, which connects the n-type gallium oxide layer 1a and the anode electrode 3, is not easily formed. This restricts a current flow along the grain boundary between the n-type gallium oxide layer 1a and the anode electrode 3. As a result, the leakage current will be suppressed at a reverse bias. This helps improving the withstand voltage.

More preferably, crystal grains included within a distance range of 200 nm from the interface between the p-type $Cu_2O$ layer 4A and the n-type semiconductor layer 1a in the microcrystalline structure have crystalline sizes smaller than 100 nm in the direction of the film thickness of the p-type $Cu_2O$ layer 4A. This reduces crystalline sizes within a range where a depletion layer is in particular likely to expand.

In the present embodiment, the anode electrode 3 is provided on the n-type gallium oxide layer 1a and on the p-type $Cu_2O$ layer 4A. In other words, the anode electrode 3 is in contact with the surfaces of the n-type gallium oxide layer 1a and the p-type $Cu_2O$ layer 4A. The anode electrode 3 forms a Schottky junction with the n-type gallium oxide layer 1a. In order for the anode electrode 3 to form a Schottky junction with the n-type gallium oxide layer 1a, the material for the anode electrode 3 is a metallic material having a work function greater than that of the n-type gallium oxide layer 1a. Moreover, the material for the anode electrode 3 is preferably selected such that the anode electrode 3 can form an ohmic junction with the p-type $Cu_2O$ layer 4A. Examples of the metallic material to be used include platinum (Pt), nickel (Ni), gold (Au), and palladium (Pd).

The anode electrode 3 may have a laminated structure. For example, a first layer is formed by depositing a metallic material suitable for an ohmic junction with the p-type $Cu_2O$ layer 4A on the p-type $Cu_2O$ layer 4A, and then a second layer that comes in contact with the first layer and the n-type gallium oxide layer 1a may be formed by depositing a metallic material suitable for a Schottky junction with the n-type gallium oxide layer 1a. Alternatively, a first layer that comes in contact with the n-type gallium oxide substrate 1 and the p-type $Cu_2O$ layer 4A may be formed of a metallic material that is susceptible to oxidation, and a second layer may be formed of a metallic material that is resistant to oxidation, on the first layer. For example, the first layer that comes in contact with the n-type gallium oxide substrate 1 and the p-type $Cu_2O$ layer 4A may be formed of Ni, and the second layer may be formed thereon of Au or Ag.

The p-type $Cu_2O$ layer 4A configures a guard ring region 4g having an opening on the n-type gallium oxide layer 1a. The guard ring region 4g is disposed adjacent to and around the Schottky junction between the n-type gallium oxide layer 1a and the anode electrode 3. With this configuration, when a high voltage is applied to the anode electrode 3, a depletion layer expands from the outer peripheral edge of the Schottky junction between the anode electrode 3 and the n-type gallium oxide layer 1a into the n-type gallium oxide layer 1a. This alleviates an electric field in the vicinity of the outer peripheral edge. Accordingly, the withstand voltage will be increased at a reverse voltage bias.

The insulating layer 5 is disposed on the n-type gallium oxide layer 1a on which the p-type $Cu_2O$ layer 4A is provided. That is, the insulating layer 5 includes a portion formed on the p-type $Cu_2O$ layer 4A and a portion formed on the n-type gallium oxide layer 1a. The insulating layer 5 has an opening that includes the opening of the guard ring region 4g. The opening edge of the insulating layer 5 is disposed on the guard ring region 4g. Part of the anode electrode 3, specifically the edge portion of the anode electrode 3, is disposed on the insulating layer 5. Out of the edge portion of the anode electrode 3, a portion that is located outward of the guard ring region 4g is disposed on the n-type gallium oxide layer 1a via the insulating layer 5, forming a field plate structure. The presence of the field plate structure improves the reverse withstand voltage of the Schottky barrier diode 10.

The material for the insulating layer 5 preferably has a bandgap greater than that of $Ga_2O_3$, which is the material for the n-type gallium oxide layer 1a serving as the n-type semiconductor layer. Also, the material for the insulating layer 5 preferably has a dielectric breakdown limit higher than that of $Ga_2O_3$, which is the material for the n-type gallium oxide substrate 1. Examples of the material for the insulating layer 5 include silicon dioxide ($SiO_2$), silicon nitride (SiN), and aluminum oxide ($Al_2O_3$). The thickness of the insulating layer 5 may be approximately several hundred nanometers and is, for example, in the range of approximately 200 nm to 400 nm.

The cathode electrode 2 is provided entirely or partially on the lower surface of the n-type gallium oxide substrate 1. The cathode electrode 2 forms an ohmic junction with the n-type gallium oxide substrate 1. Thus, the cathode electrode 2 forms an ohmic contact with the n-type gallium oxide layer 1a in terms of electricity. In order for the cathode electrode 2 to form an ohmic junction with the n-type gallium oxide substrate 1, the material for the cathode electrode 2 is preferably a metallic material that has a work function less than that of the material for the n-type gallium oxide substrate 1. Also, the material for the cathode electrode 2 is preferably a metallic material that reduces contact resistance between the n-type gallium oxide substrate 1 and the cathode electrode 2 through heat treatment, which is performed after the cathode electrode 2 is deposited on the lower surface of the n-type gallium oxide substrate 1. For example, titanium (Ti) is used as the metallic material. The cathode electrode 2 may have a laminated structure. In the laminated structure, if a layer that comes in contact with the lower surface of the n-type gallium oxide substrate 1 is made of a material that is susceptible to oxidation, a layer to be disposed thereon is preferably made of a material that is resistant to oxidation. For example, the laminated structure may include a Ti layer that comes in contact with the surface of the n-type gallium oxide substrate 1 and a gold (Au) or silver (Ag) layer that is disposed on the Ti layer.

Manufacturing Method

Figure 3:
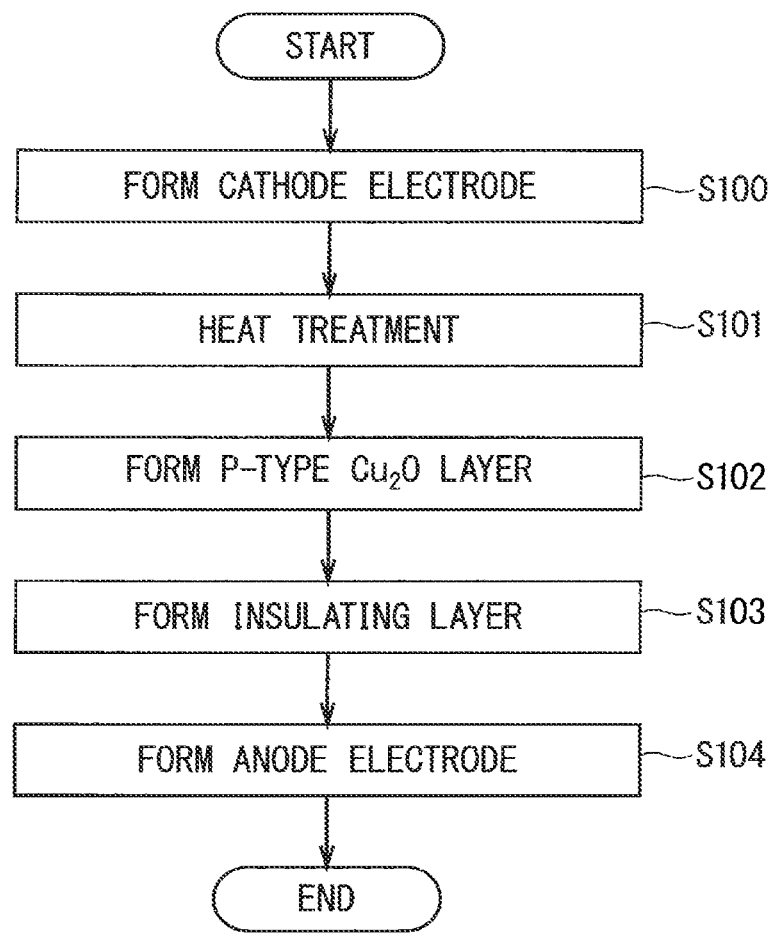
FIG. 3 is a flow chart schematically illustrating a method of manufacturing the power semiconductor device according to Embodiment 1 of the present invention.
Figure 4:
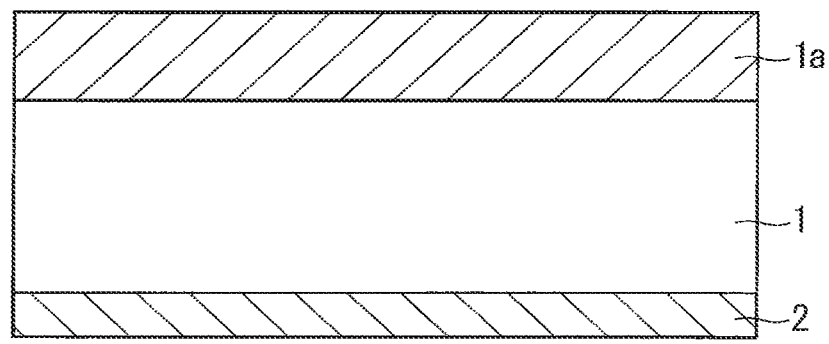
FIG. 4 is a sectional view schematically illustrating one step in the method of manufacturing the power semiconductor device according to Embodiment 1 of the present invention.
Figure 5:
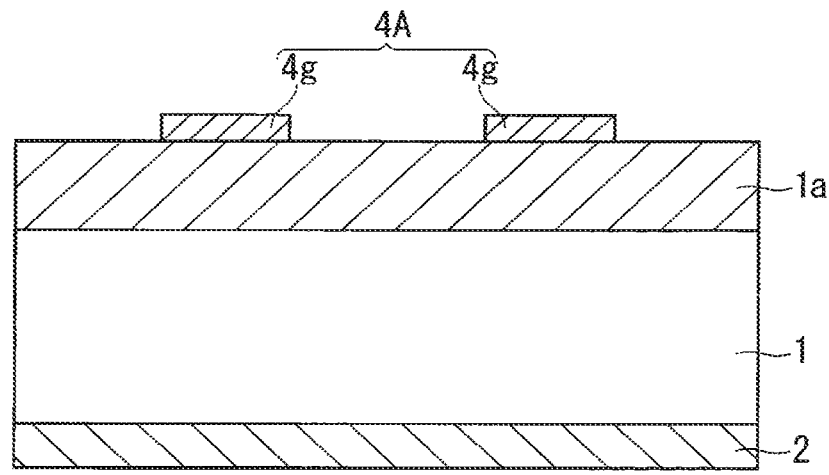
FIG. 5 is a sectional view schematically illustrating one step in the method of manufacturing the power semiconductor device according to Embodiment 1 of the present invention.
Figure 6:
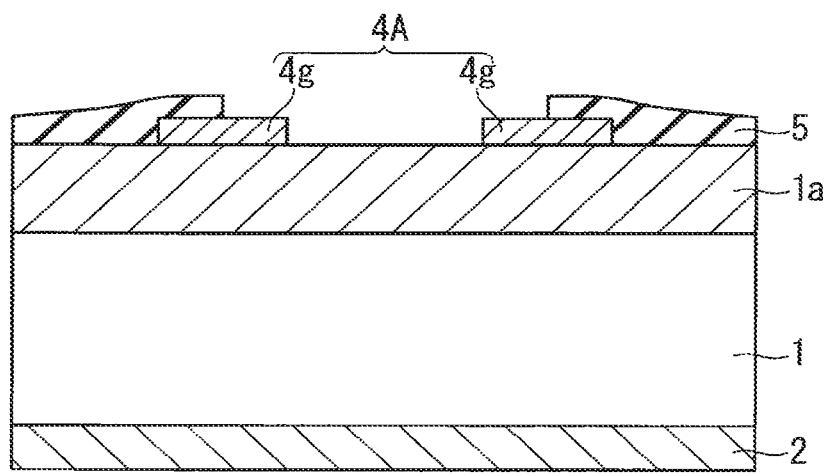
FIG. 6 is a sectional view schematically illustrating one step in the method of manufacturing the power semiconductor device according to Embodiment 1 of the present invention.

FIG. 3 is a flow chart schematically illustrating a method of manufacturing the Schottky barrier diode 10. FIGS. 4 to 6 are sectional views each schematically illustrating one step in the method of manufacturing the Schottky barrier diode 10.

Referring to FIG. 4, first, the n-type gallium oxide substrate 1 is prepared. The n-type gallium oxide substrate 1 is obtained by, for example, being cut out in a substrate shape from a single-crystal bulk of β-Ga$_2$O$_3$ produced by a melt growth method. Next, the n-type gallium oxide layer 1a is formed on the upper surface of the n-type gallium oxide substrate 1. For this, epitaxial growth is conducted by, for example, molecular beam epitaxy (MBE) or halide vapor phase epitaxy (HVPE). In this way, an epitaxial substrate of n-type gallium oxide is obtained.

Next, the cathode electrode 2 is formed on the lower surface of the n-type gallium oxide substrate 1 in step S100 (FIG. 3). For this, a metallic material may be deposited by vapor deposition or sputtering. For example, a Ti layer with a thickness of 100 nm and an Ag layer with a thickness of 300 nm are deposited in succession by electron-beam evaporation (EB evaporation) to form the cathode electrode 2 having a two-layer structure.

Next, the cathode electrode 2 is subjected to heat treatment in step S101 (FIG. 3). For example, the heat treatment is performed at 550° C. for five minutes in a nitrogen or oxygen atmosphere. As a result, the n-type gallium oxide substrate 1 and the cathode electrode 2 form an ohmic junction.

Referring to FIG. 5, next, the p-type Cu$_2$O layer 4A is deposited on the n-type gallium oxide layer 1a in step S102. This deposition is performed, for example, by sputtering using a Cu target in a mixed gas of argon (Ar) gas, oxygen (O$_2$) gas, and nitrogen (N$_2$) gas or by sputtering using a Cu$_2$O target in a mixed gas of Ar gas and N$_2$. If N$_2$ partial pressure in the mixed gas is increased, the carrier density of the p-type Cu$_2$O layer 4A will increase and accordingly p-type conductivity will increase. On the contrary, if N$_2$ partial pressure in the mixed gas is reduced, the carrier density of the p-type Cu$_2$O layer 4A will decrease and accordingly p-type conductivity will decrease. Note that other methods such as reactive plasma deposition (RPD) or ion plating may be used, instead of sputtering.

As described previously, the p-type Cu$_2$O layer 4A is formed to have a microcrystalline structure or an amorphous structure. The crystalline sizes in the microcrystalline structure can be controlled by controlling the substrate temperature during the aforementioned deposition. For example, crystalline sizes of approximately 0.8 μm to 1 μm are obtained with a substrate temperature higher than or equal to 600° C. In general, the microcrystalline structure or the amorphous structure is required to have crystalline sizes as small as possible, so that the substrate temperature is preferably set lower than or equal to 200° C. and more preferably lower than or equal to 100° C. In the case of using Cu$_2$O as the material for the p-type semiconductor layer, an amorphous component is not observed obviously but in the case of using other oxide materials such as NiO, it is possible, by reducing the substrate temperature, to form a semiconductor layer where an amorphous structure can be observed.

After the aforementioned deposition, the p-type Cu$_2$O layer 4A may be patterned by a photolithographic or etching process. In the case where wet etching is used in the etching process, for example, a buffered hydrofluoric acid can be used as an etchant. In the case where dry etching is used in the etching process, for example, reactive ion etching (RIE) using a gas containing Ar or hexafluoroacetylacetone can be used.

In the case where, instead of the Cu$_2$O layer, other metal oxide layers are used as the p-type semiconductor layer, other metal targets or metal oxide targets, such as an Ni target or an NiO target, may be used instead of the aforementioned Cu or Cu$_2$O target.

Referring to FIG. 6, next in step S103, the insulating layer 5 is deposited on the upper surface of the n-type gallium oxide substrate 1 on which the p-type Cu$_2$O layer 4A is provided in part. This deposition is performed by, for example, sputtering, chemical vapor deposition (CVD), or atomic layer deposition (ALD).

After the aforementioned deposition, the insulating layer 5 may be patterned by a photolithographic or etching process. In the case where wet etching is used in the etching process, for example, a buffered hydrofluoric acid can be used as an etchant. In the case where dry etching is used in the etching process, for example, RIE using a mixed gas of CF$_4$ and oxygen can be used. In the RIE using this mixed gas, the etch rate of the p-type Cu$_2$O layer 4A is lower than that of the insulating layer 5. Thus, the etching can be stopped easily in order to leave a portion of the p-type Cu$_2$O layer 4A that is located immediately below an unnecessary portion of the insulating layer 5 while removing the unnecessary portion of the insulating layer 5.

Referring again to FIG. 1, ultimately, the anode electrode 3 is formed in step S104. For example, a metallic material is deposited by vapor deposition or sputtering on the n-type gallium oxide layer 1a on which the p-type Cu$_2$O layer 4A is provided. As described previously, the anode electrode 3 forms a Schottky junction with the n-type gallium oxide layer 1a and forms an ohmic junction with the p-type Cu$_2$O layer 4A. The metallic material for the anode electrode 3 has a work function greater than that of the n-type gallium oxide layer 1a. For example, a Pt layer with a thickness of 100 nm and an Au layer with a thickness of 300 nm are deposited in succession by EB evaporation so as to form the anode electrode 3 having a two-layer structure. The patterning of the anode electrode 3 is preferably performed by a lift-off method. That is, it is preferable that, prior to the deposition of the metallic material for the anode electrode 3, a resist pattern is formed in advance by photolithography, and after the deposition of the metallic material, patterning is performed by exfoliation of the resist pattern. In the way described above, the Schottky barrier diode 10 is obtained.

Variations

Although the n-type gallium oxide layer 1a is used as the n-type semiconductor layer in the above description, a wide-gap semiconducting material other than gallium oxide can also be used. Preferably, at least one of an oxide containing gallium elements or a material containing aluminum elements is used as a wide-gap semiconducting material. Alternatively, the wide-gap semiconducting material may be a nitride such as Al$_{(1-x)}$Ga$_x$N (where 1>x≥0). In this case, a strong bond between Al and nitrogen will inhibit the progress of deterioration due to oxidation, for example unless the material is heated to a high temperature higher than or equal to approximately 600° C. Thus, the n-type semiconductor layer can form a favorable pn junction with the p-type semiconductor layer made of an oxide.

Although the p-type Cu$_2$O layer 4A is used as the p-type semiconductor layer, a metal oxide semiconductor other than Cu$_2$O may also be used, and for example, NiO may be used. Also, impurities may be added to the p-type semiconductor layer. In particular, in the case where the n-type semiconductor layer is made of an oxide or nitride, a good-quality stable pn junction can be formed because the p-type semiconductor layer is made of an oxide semiconductor. It is, however, preferable that the material for the p-type semiconductor layer is selected such that a pn junction is formed to have a barrier height higher than that of the Schottky junction formed between the n-type semiconductor layer and the anode electrode. Specifically, the pn junction is preferably formed to have a barrier height higher than or equal to 1.2 eV when viewed from the electron side.

Although the n-type gallium oxide substrate 1 is used as a substrate on which the n-type semiconductor layer is to be formed, a material other than gallium oxide can also be used. The material for the substrate does not necessarily have to be the same as the material for the n-type semiconductor layer that is formed on the substrate. For example, the n-type gallium oxide layer 1a serving as the n-type semiconductor layer may be formed on a sapphire substrate serving as a single-crystal substrate; in this case, the n-type semiconductor layer and the single-crystal substrate form a heterojunction. In the case where the material for the substrate is an insulator as in the case of using a sapphire substrate, the cathode electrode may be connected directly to the n-type semiconductor layer, not via the substrate.

EXAMPLE

The withstand voltage of a Schottky barrier diode according to an example applying the present embodiment was measured and found to be higher than or equal to 1.2 kV. On the other hand, the withstand voltage of a Schottky barrier diode according to a comparative example including neither the p-type $Cu_2O$ layer 4A nor the guard ring region 4g was measured and found to be approximately 1.0 kV. This indicates that the use of the p-type $Cu_2O$ layer 4A as the p-type semiconductor layer and the presence of the guard ring region 4g can improve the withstand voltage of the Schottky barrier diode.

Summary of Effects

According to the present embodiment and variations thereof, the material for the p-type semiconductor layer differs from the wide-gap semiconducting material for the n-type semiconductor layer. In particular, according to the present embodiment, the n-type gallium oxide layer 1a is provided as the n-type semiconductor layer, and the p-type $Cu_2O$ layer 4A is provided as the p-type semiconductor layer. Thus, the material that can impart p-type conductivity more easily than the material for the n-type semiconductor layer is selected as the material for the p-type semiconductor layer. Moreover, the p-type semiconductor layer has either a microcrystalline structure or an amorphous structure. Thus, the p-type semiconductor layer can be formed on the n-type semiconductor layer without being greatly affected by the crystal structure and shape of the surface of the n-type semiconductor layer. This stabilizes the properties of the heterojunction between the n-type semiconductor layer and the p-type semiconductor layer. From the above, it is possible to form a favorable pn junction on the n-type semiconductor layer, which is made of a wide-gap semiconductor. Using a structure including this pn junction can improve the withstand voltage of the power semiconductor device.

An oxide (gallium oxide) material that contains gallium elements and is used as a wide-gap semiconducting material is typically $Al_{2(1-x)}Ga_{2x}O_3$ (where $1 \geq x > 0$). Also, a material that contains aluminum elements and is used as a wide-gap semiconducting material is typically $Al_{(1-x)}Ga_xN$ (where $1 > x \geq 0$) and $Al_{2(1-x)}Ga_{2x}O_3$ (where $1 > x > 0$). In general, such materials have great difficulty in imparting p-type conductivity. According to the present embodiment, a favorable pn junction can be formed even in the case of using an n-type semiconductor layer made of such a semiconducting material. The language "contains gallium elements" as used herein refers to the fact that the base material itself of the semiconducting material contains gallium elements, i.e., contains gallium elements as part of its main component. Similarly, the language "contains aluminum elements" as used herein refers to the fact that the base material itself of the semiconducting material contains aluminum elements, i.e., contains aluminum elements as part of its main component.

In the case where $Cu_2O$, i.e., an oxide, is used as the material for the p-type semiconductor layer as in the present embodiment, the wide-gap semiconducting material for the n-type semiconductor layer is preferably an oxide. In this case, a favorable heterojunction can be formed between the oxides. The reason for this is that in the case where an oxide layer is formed as the p-type semiconductor layer on the n-type semiconductor layer and the n-type semiconductor layer is also an oxide, it is possible to avoid deterioration in the semiconducting properties of the n-type semiconductor layer due to occurrence of oxidation from the p-type semiconductor layer into the n-type semiconductor layer.

Preferably, crystal grains included in the microcrystalline structure have crystalline sizes smaller than the average film thickness of the p-type semiconductor layer in the direction of the film thickness of the p-type semiconductor layer. This avoids each single crystal grain from passing through the p-type semiconductor layer. Thus, an undesirable flow of leakage current along the grain boundary as a path can be suppressed. Accordingly, for example, it is possible to reduce the leakage current when a reverse bias is applied to the Schottky barrier diode 10.

Preferably, crystal grains included in the microcrystalline structure have crystalline sizes smaller than a half of the average film thickness of the p-type semiconductor layer in the direction of the film thickness of the p-type semiconductor layer. This avoids two crystal grains stacked one above the other in the thickness direction from passing through the p-type semiconductor layer. Thus, an undesirable flow of leakage current along the grain boundary as a path can be suppressed. Accordingly, for example, it is possible to reduce the leakage current when a reverse bias is applied to the Schottky barrier diode 10.

Preferably, crystal grains included within a distance range of 200 nm from the interface between the p-type semiconductor layer and the n-type semiconductor layer in the microcrystalline structure of the p-type semiconductor layer have crystalline sizes smaller than 100 nm in the direction of the film thickness of the p-type semiconductor layer. The neighborhood of the interface of the pn junction, in particular, the distance range of approximately 200 nm therefrom, is a range where an electric field is likely to be applied. Thus, crystal grains within that range preferably have crystalline sizes smaller than 100 nm, which is a half of 200 nm, in the direction of the film thickness of the p-type semiconductor layer. This avoids two crystal grains stacked one above the other in the thickness direction from passing through that range. Thus, an undesirable flow of leakage current along the grain boundary as a path can be suppressed. Accordingly, for example, it is possible to reduce the leakage current when a reverse bias is applied to the Schottky barrier diode 10. More preferably, crystal grains included within a distance range of 100 nm from the interface between the p-type semiconductor layer and the n-type semiconductor layer in the microcrystalline structure have crystalline sizes smaller than 50 nm in the direction of the film thickness of the p-type semiconductor layer. The neighborhood of the interface of the pn junction, in particular, the distance range of approximately 100 nm therefrom, is a range where an electric field is in particular likely to be applied. Therefore, crystal grains within that range preferably have crystalline sizes smaller than 50 nm, which is a half of 100 nm, in the direction of the film thickness of the p-type semiconductor layer. This avoids two crystal grains stacked one above the other in the thickness direction from passing through that range. Thus, an undesirable flow of leakage current along the grain boundary as a path can be suppressed. Accordingly, for example, it is possible to reduce the leakage current when a reverse bias is applied to the Schottky barrier diode 10.

Preferably, the p-type semiconductor layer contains Cu or Ni and is, for example, $Cu_2O$ or NiO. In this case, a pn junction with excellent electrical characteristics can be formed.

Preferably, the barrier between the p-type semiconductor and the n-type semiconductor layer, viewed from the electron side, is higher than or equal to 1.2 eV. This is described below.

In general, Pt has the greatest work function. Thus, the electron barrier height of a Schottky electrode can be increased by using Pt as an electrode material. In particular, the electron barrier height of $Pt/Ga_2O_3$ is approximately 1.15 eV. On the other hand, the power semiconductor device using a wide-gap semiconductor is expected to operate in a temperature range from the room temperature to a high temperature of approximately 200° C. In other words, the power semiconductor device is expected to operate in an absolute temperature range of 300K to 500K. This temperature range corresponds to energies of approximately 0.025 to 0.043 eV. Thus, if the electron barrier between the p-type semiconductor and the n-type semiconductor layer is higher than 1.15+0.043=1.19 eV (i.e., higher than or equal to 1.2 eV), the leakage current can be suppressed more effectively than in the case of using a Schottky barrier formed by electrodes.

Embodiment 2

Configuration

Figure 7:
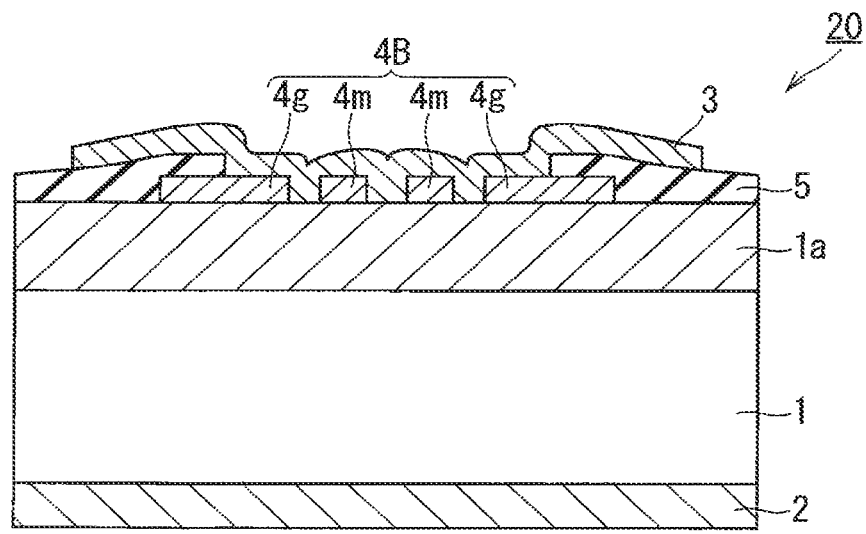
FIG. 7 is a sectional view schematically illustrating a configuration of a power semiconductor device according to Embodiment 2 of the present invention.
Figure 8:
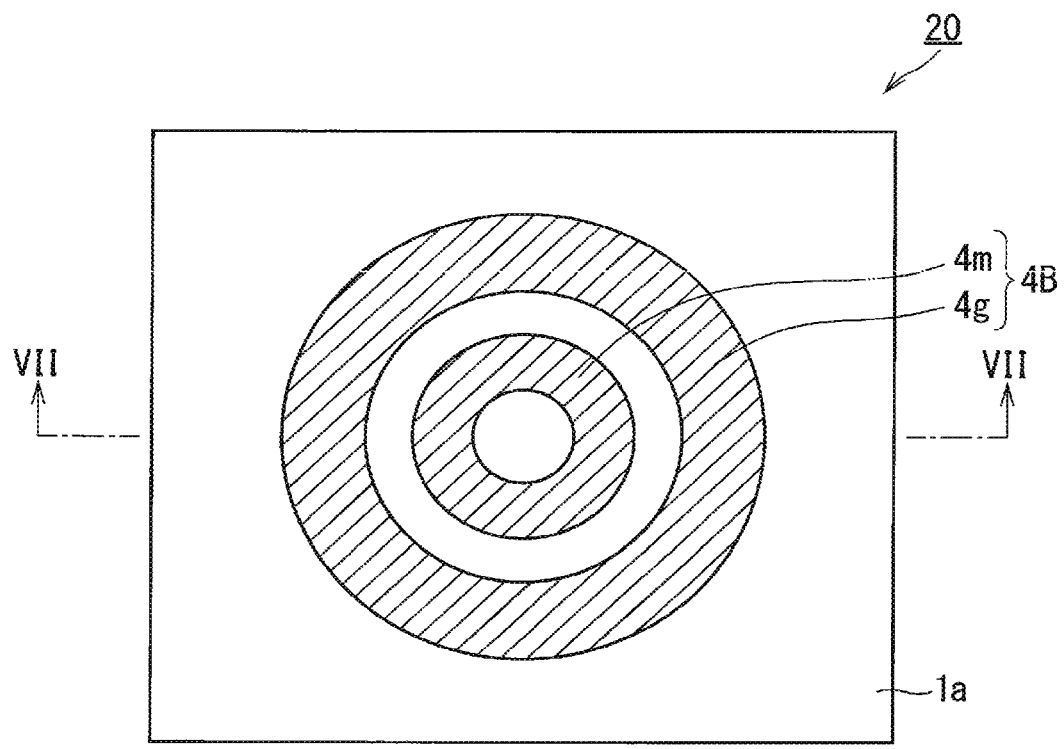
FIG. 8 is a plan view schematically illustrating an arrangement of a p-type semiconductor layer on an n-type semiconductor layer in the power semiconductor device in FIG. 7.

FIG. 7 is a sectional view schematically illustrating a configuration of a Schottky barrier diode 20 (power semiconductor device) according to Embodiment 2 of the present invention. FIG. 8 is a plan view schematically illustrating an arrangement of a p-type $Cu_2O$ layer 4B (p-type semiconductor layer) on the n-type gallium oxide layer 1a in the Schottky barrier diode 20. Note that the p-type $Cu_2O$ layer 4B is hatched in this plan view in order to facilitate viewing of the drawing. The Schottky barrier diode 20 includes the p-type $Cu_2O$ layer 4B, instead of the p-type $Cu_2O$ layer 4A (FIGS. 1 and 2) of Embodiment 1. The p-type $Cu_2O$ layer 4B includes a merged pn Schottky (MPS) region 4m, in addition to the guard ring region 4g (FIGS. 1 and 2) described in Embodiment 1. The MPS region 4m is disposed inward of and away from the guard ring region 4g. The MPS region 4m and the guard ring region may be arranged concentrically. Although one MPS region 4m is illustrated in FIG. 7, a plurality of MPS regions may be provided. The width of each MPS region, the width between MPS regions, and the pitch of the MPS regions may be appropriately determined according to the desired withstand voltage and the desired resistance loss. Note that the configuration other than that described above is almost identical to that of Embodiment 1 described above, so that constituent elements that are identical or correspond to those described above are given the same reference numerals and description thereof is not repeated.

According to the present embodiment, the p-type $Cu_2O$ layer 4B includes the MPS region 4m. Thus, the Schottky barrier diode 20 has a structure serving as an MPS diode. This structure includes a pn diode structure consisting of the MPS region 4m and the n-type gallium oxide layer 1a and a Schottky diode structure consisting of the anode electrode 3 and the n-type gallium oxide layer 1a. If a forward bias voltage is increased, current in the Schottky diode structure will rise in advance. This suppresses resistance loss. Also, it is possible to pass a large current by using both of the structures. If a reverse bias voltage is applied, a depletion layer will expand from the interface between the p-type $Cu_2O$ layer 4B and the n-type gallium oxide layer 1a downward to the Schottky junction between the anode electrode 3 and the n-type gallium oxide layer 1a. This alleviates an electric field applied at the interface between the anode electrode 3 and the n-type gallium oxide layer 1a. Accordingly, it is possible to reduce the leakage current and to further improve the withstand voltage.

Manufacturing Method

Figure 9:
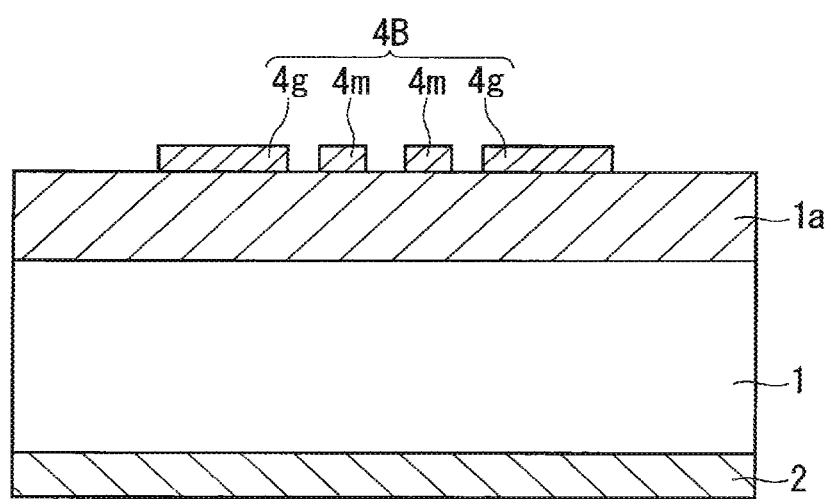
FIG. 9 is a sectional view schematically illustrating one step in the method of manufacturing the power semiconductor device according to Embodiment 2 of the present invention.

FIGS. 9 and 10 are sectional views each schematically illustrating one step in the method of manufacturing the Schottky barrier diode 20. The Schottky barrier diode 20 according to Embodiment 2 can also be manufactured in accordance with approximately the same flowchart as that of Embodiment 1 in FIG. 3.

Referring to FIG. 9, this method differs from the manufacturing method of Embodiment 1 in that the p-type Cu2O layer 4B, which is formed in step S102 (FIG. 3), includes not only the guard ring region 4g but also the MPS region 4m. The guard ring region 4g and the MPS region 4m may be formed simultaneously, and in this case, the difference from Embodiment 1 lies in only the pattern shape. Alternatively, the guard ring region 4g and the MPS region 4m may be formed individually. That is, one of the guard ring region 4g and the MPS region 4m may be formed by deposition and patterning, and then the other may be formed by another deposition and patterning. In this case, deposition conditions for the guard ring region 4g may be made different from those for the MPS region 4m. By so doing, the physical properties of each of the guard ring region 4g and the MPS region 4m can be optimized individually.

Referring to FIG. 10, next, the insulating layer 5 is formed by approximately the same method as that in the step of Embodiment 1 in FIG. 6. Subsequent steps are the same as those in Embodiment 1.

Embodiment 3

Configuration

Figure 12:
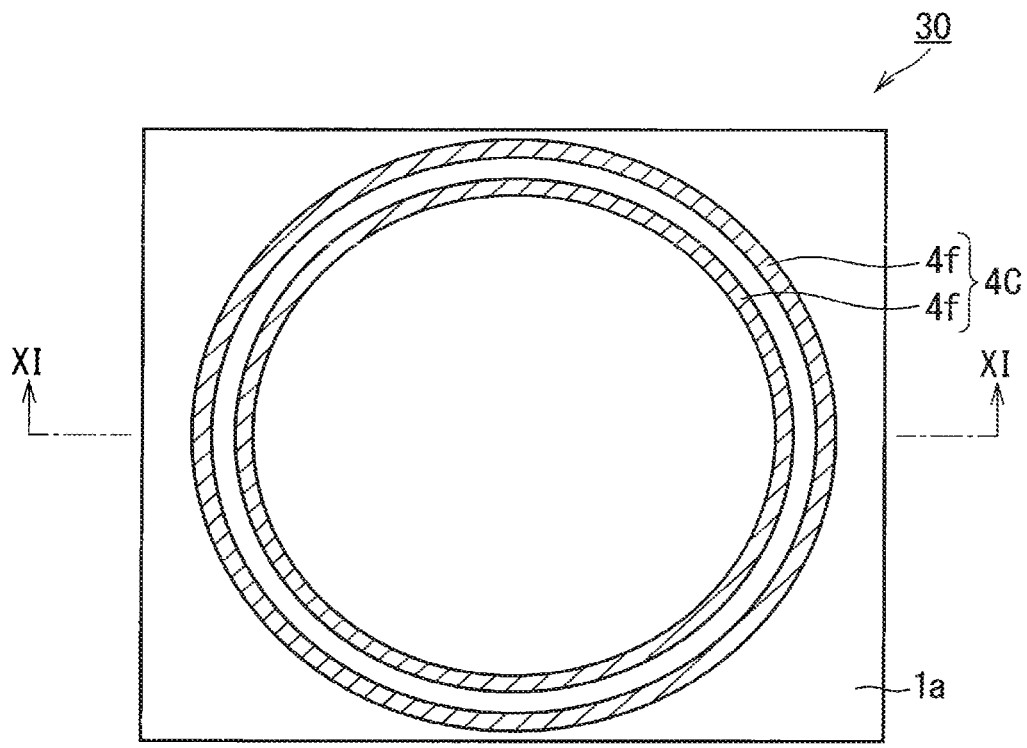
FIG. 12 is a plan view schematically illustrating an arrangement of a p-type semiconductor layer on an n-type semiconductor layer in the power semiconductor device in FIG. 11.

FIG. 11 is a sectional view schematically illustrating a configuration of a Schottky barrier diode 30 (power semiconductor device) according to Embodiment 3 of the present invention. FIG. 12 is a plan view schematically illustrating an arrangement of a p-type $Cu_2O$ layer 4C (p-type semiconductor layer) on the n-type gallium oxide layer 1a in the Schottky barrier diode 30. Note that the p-type $Cu_2O$ layer 4C is hatched in this plan view in order to facilitate viewing of the drawing. The Schottky barrier diode 30 includes the p-type $Cu_2O$ layer 4C, instead of the p-type $Cu_2O$ layer 4A (FIGS. 1 and 2) of Embodiment 1.

In the Schottky barrier diode 30, an edge portion of the anode electrode 3 that is located on the insulating layer 5 is disposed on the n-type gallium oxide layer 1a via the insulating layer 5, thereby forming a field plate structure. The presence of the field plate structure can improve the reverse withstand voltage of the Schottky barrier diode 10.

The p-type Cu$_2$O layer 4C includes FLR regions 4f. The FLR regions 4f are disposed along the outer circumference of the field plate structure. The FLR regions 4f are spaced from the anode electrode 3 and is in a floating state. Since the FLR regions 4f alleviate an electric field, it is possible to achieve a high withstand voltage of the Schottky barrier diode 30.

Note that the configuration other than that described above is approximately the same as that of Embodiment 1 described above, so that constituent elements that are identical or similar to those in Embodiment 1 are given the same reference numerals, and description thereof is not repeated.

Manufacturing Method

Figure 13:
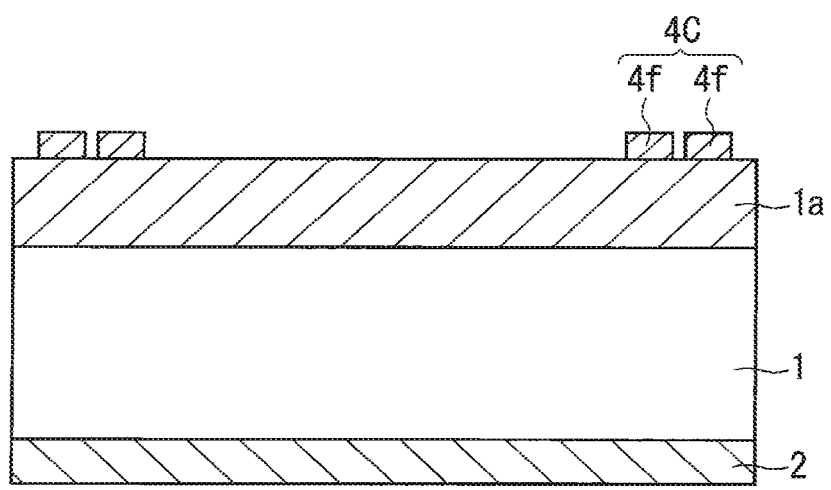
FIG. 13 is a sectional view schematically illustrating one step in the method of manufacturing the power semiconductor device according to Embodiment 3 of the present invention.
Figure 14:
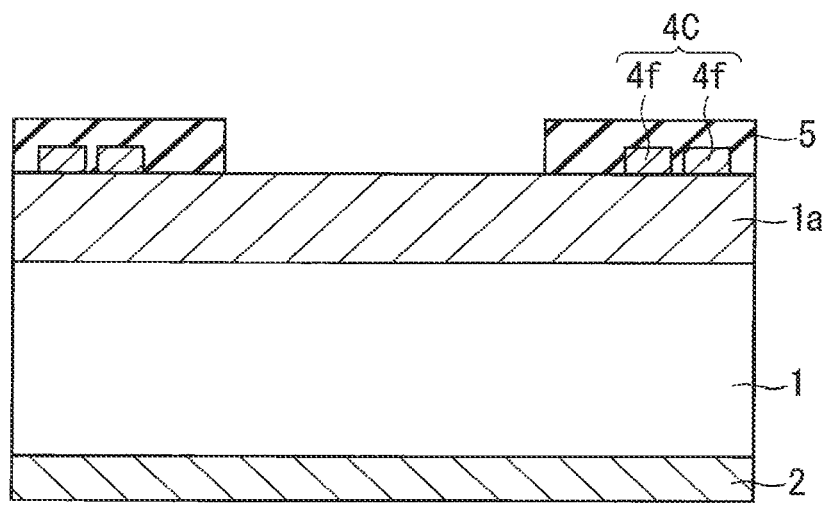
FIG. 14 is a sectional view schematically illustrating one step in the method of manufacturing the power semiconductor device according to Embodiment 3 of the present invention.

FIGS. 13 and 14 are sectional views each schematically illustrating one step in the method of manufacturing the Schottky barrier diode 30. The Schottky barrier diode 30 according to Embodiment 3 of the present invention can also be manufactured in accordance with approximately the same flowchart as that of Embodiment 1 in FIG. 3.

Referring to FIG. 13, this method differs from the manufacturing method of Embodiment 1 in that the p-type Cu2O layer 4C, which is formed in step S102 (FIG. 3), includes the FLR regions 4f, instead of the guard ring region 4g. Referring to FIG. 14, next, the insulating layer 5 is formed so as to cover the FLR regions 4f. Subsequent steps are the same as those of Embodiment 1.

Variations

The guard ring region 4g of the Schottky barrier diode 10 (FIG. 1) according to Embodiment 1 may be added to the Schottky barrier diode 30. Alternatively, the guard ring region 4g and the MPS region 4m of the Schottky barrier diode 20 (FIG. 7) according to Embodiment 2 may be added to the Schottky barrier diode 30.

Embodiment 4

Configuration

Figure 15:
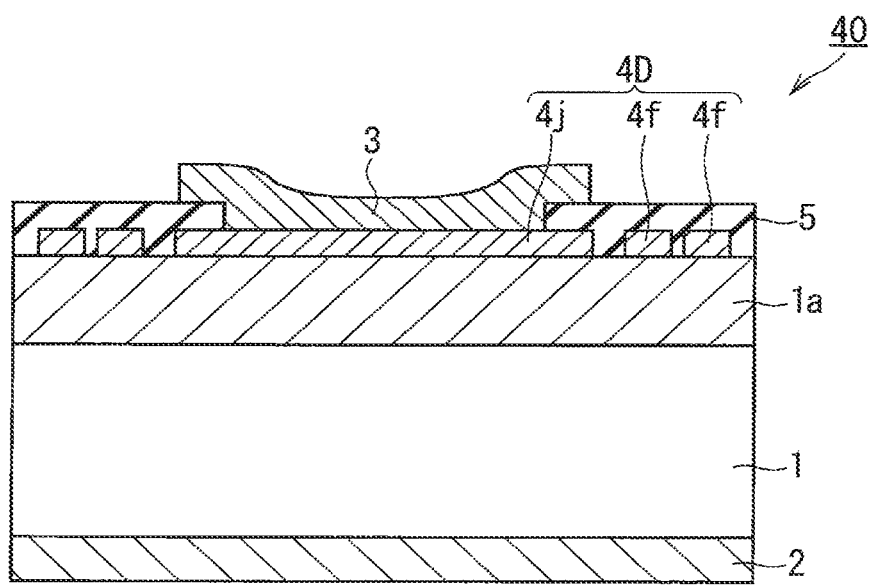
FIG. 15 is a sectional view schematically illustrating a configuration of a power semiconductor device according to Embodiment 4 of the present invention.
Figure 16:
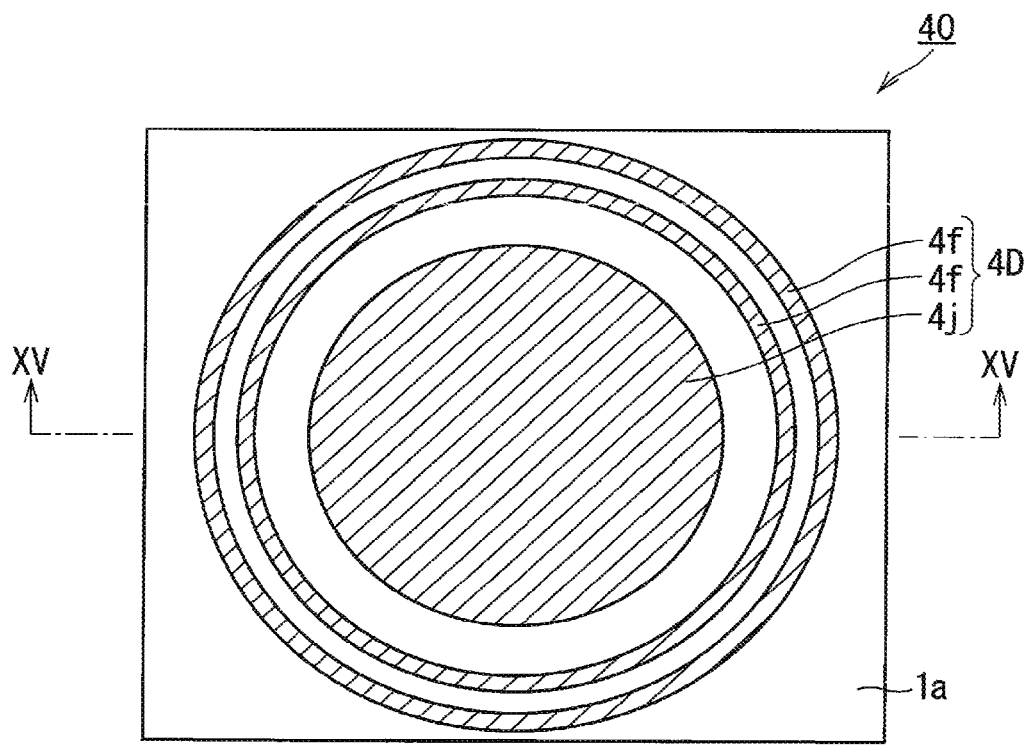
FIG. 16 is a plan view schematically illustrating an arrangement of a p-type semiconductor layer on an n-type semiconductor layer in the power semiconductor device in FIG. 15.

FIG. 15 is a sectional view schematically illustrating a configuration of a pn diode 40 (power semiconductor device) according to Embodiment 4 of the present invention. FIG. 16 is a plan view schematically illustrating an arrangement of a p-type Cu$_2$O layer 4D (p-type semiconductor layer) on the n-type gallium oxide layer 1a in the pn diode 40. Note that the p-type Cu$_2$O layer 4D is hatched in this plan view in order to facilitate viewing of the drawing. The pn diode 40 includes the p-type Cu$_2$O layer 4D, instead of the p-type Cu$_2$O layer 4C (FIGS. 11 and 12). The p-type Cu$_2$O layer 4D includes an anode region 4j in addition to the FLR regions 4f (FIGS. 11 and 12) described in Embodiment 3.

In the present embodiment, the anode electrode 3 forms an ohmic contact with the anode region 4j of the p-type Cu$_2$O layer 4D. Also, the anode electrode 3 does not form a Schottky junction with the n-type gallium oxide layer 1a. That is, the pn diode 40 has a pn diode structure, but does not have a Schottky barrier diode structure. Using only the pn diode structure as a diode structure allows a larger current to flow per unit area at a forward bias. Also, the leakage current can be suppressed at a reverse bias. Accordingly, the withstand voltage of the diode can be increased.

Current in the pn diode 40 needs to pass through the anode region 4j. Thus, the film thickness and conductivity of the anode region 4j relate greatly to resistance loss characteristics and leakage current characteristics of the pn diode 40. In view of this, the carrier density of the anode region 4j is preferably on the order of 10 to the 18th power or higher, and the thickness thereof is preferably greater than or equal to 10 nm and less than or equal to 500 nm. If the film thickness is too small or the carrier density is too low, the anode region 4j will be depleted completely and the leakage current cannot be suppressed. If the film thickness is too large, the resistance loss will increase excessively. Since the anode region 4j has a microcrystalline structure or an amorphous structure, it exhibits a lower carrier mobility than in the case of using a single-crystal structure. Thus, the resistance loss in the pn diode 40 is likely to increase with the increase in the film thickness of the anode region 4j. In order to compensate for that low carrier mobility, the anode region 4j preferably has a carrier density of the order of 10 to the 18th power or higher. In the case of using a Cu$_2$O layer (or NiO layer) having a microcrystalline structure or an amorphous structure, a carrier density of the order of 10 to the 19th power or higher can be obtained easily. Thus, the resistance loss can be suppressed easily.

On the other hand, the FLR regions 4f disposed on the outer circumference of the anode region 4j are electrically in a floating state and do not form a current path of the pn diode 40. Thus, the FLR regions 4f are not directly related to the resistance loss in the pn diode 40. Therefore, the carrier density of the FLR regions 4f may be made different from that of the anode region 4j in order to optimize the alleviation of an electric field. For example, a FLR region 4f disposed on the more outer side may have a lower carrier density.

Note that the configuration other than that described above is approximately the same as that of Embodiment 3 described above, so that constituent elements that are identical or correspond to those of Embodiment 3 are given the same reference numerals and description thereof is not repeated.

Manufacturing Method

Figure 17:
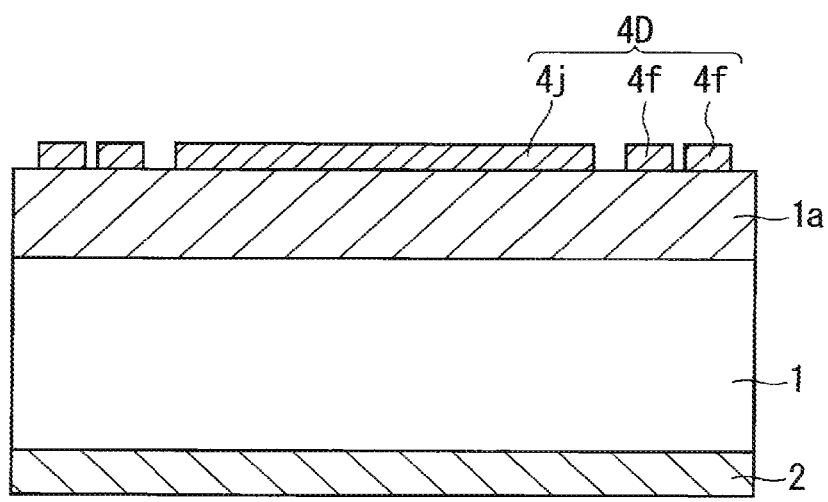
FIG. 17 is a sectional view schematically illustrating one step in the method of manufacturing the power semiconductor device according to Embodiment 4 of the present invention.
Figure 18:
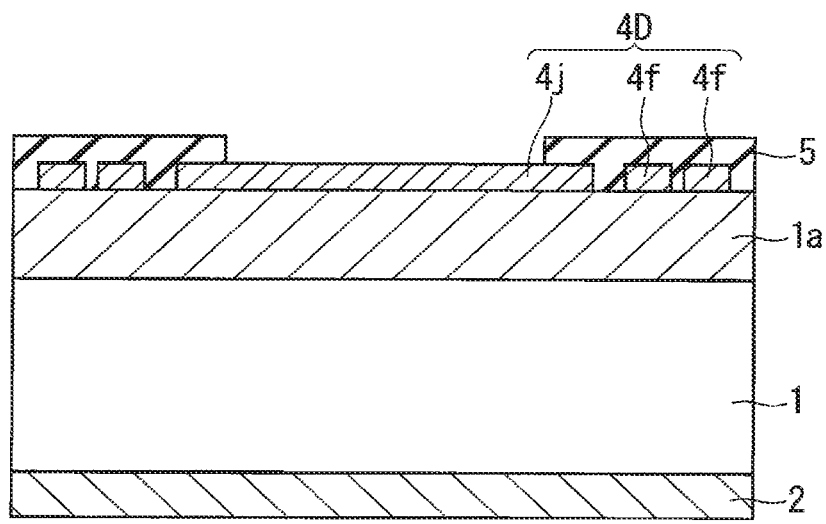
FIG. 18 is a sectional view schematically illustrating one step in the method of manufacturing the power semiconductor device according to Embodiment 4 of the present invention.

FIGS. 17 and 18 are sectional views each schematically illustrating one step in the method of manufacturing the pn diode 40. The pn diode 40 according to Embodiment 4 can also be manufactured in accordance with approximately the same flow chart as that of Embodiment 1 in FIG. 3.

Referring to FIG. 17, this method differs from the manufacturing method of Embodiment 3 in that the p-type Cu2O layer 4D, which is formed in step S102 (FIG. 3), includes the anode region 4j in addition to the FLR regions 4f Referring to FIG. 18, next, the insulating layer 5 is formed so as to cover the whole of the FLR regions 4f and the outer peripheral portion of the anode region 4j. Subsequent steps are approximately the same as those of Embodiment 1.

Note that embodiments of the present invention may be freely combined or appropriately modified or omitted within the scope of the invention. While the invention has been shown and described in detail, the foregoing description is in all aspects illustrative and not restrictive. It is therefore to be understood that numerous modifications and variations can be devised without departing from the scope of the invention.

EXPLANATION OF REFERENCE SIGNS

1: n-type gallium oxide substrate, 1a: n-type gallium oxide layer (n-type semiconductor layer), 2: cathode electrode, 3: anode electrode (electrode), 4A to 4D: p-type Cu$_2$O layer (p-type semiconductor layer), 4f: FLR region, 4g: guard ring region, 4j: anode region, 4m: MPS region, 5: insulating layer, 10, 20, 30 Schottky barrier diode (power semiconductor device), 40: pn diode (power semiconductor device).

The invention claimed is:

1. A power semiconductor device comprising:
an n-type semiconductor layer having a single-crystal structure and made of a wide-gap semiconducting material;
a p-type semiconductor layer provided on the n-type semiconductor layer, made of a material different from the wide-gap semiconducting material, and having a microcrystalline structure; and
an electrode provided on at least one of the n-type semiconductor layer and the p-type semiconductor layer,
wherein the microcrystalline structure is formed of crystal grains in an amorphous semiconductor material, and the crystal grains have smaller crystalline sizes than an average film thickness of the p-type semiconductor layer in a direction of the film thickness of the p-type semiconductor layer.

2. The power semiconductor device according to claim 1, wherein
the wide-gap semiconducting material is at least one of an oxide containing gallium elements and a material containing aluminum elements.

3. The power semiconductor device according to claim 1, wherein
the wide-gap semiconducting material for the n-type semiconductor layer is either an oxide or a nitride, and the material for the p-type semiconductor layer is an oxide.

4. The power semiconductor device according to claim 1, wherein
crystal grains included in the microcrystalline structure of the p-type semiconductor layer have smaller crystalline sizes than a half of an average film thickness of the p-type semiconductor layer in a direction of the film thickness of the p-type semiconductor layer.

5. The power semiconductor device according to claim 1, wherein
crystal grains included within a distance range of 200 nm from an interface between the p-type semiconductor layer and the n-type semiconductor layer in the microcrystalline structure of the p-type semiconductor layer has smaller crystalline sizes than 100 nm in a direction of the film thickness of the p-type semiconductor layer.

6. The power semiconductor device according to claim 1, wherein
the p-type semiconductor layer contains either Cu or Ni.

7. The power semiconductor device according to claim 1, wherein
a barrier between the p-type semiconductor and the n-type semiconductor layer, viewed from an electron side, is higher than or equal to 1.2 eV.

8. The power semiconductor device according to claim 1, wherein the p-type semiconductor layer is formed as a ring on the n-type semiconductor layer.

9. The power semiconductor device according to claim 8, wherein the p-type semiconductor layer is formed as a plurality of concentric rings on the n-type semiconductor layer.

* * * * *